United States Patent [19]
Maury et al.

[11] Patent Number: 6,051,500
[45] Date of Patent: Apr. 18, 2000

[54] DEVICE AND METHOD FOR POLISHING A SEMICONDUCTOR SUBSTRATE

[75] Inventors: Alvaro Maury; Arun K. Nanda; Omar Rodriguez, all of Orlando, Fla.

[73] Assignee: Lucent Technologies Inc., Murray Hill, N.J.

[21] Appl. No.: 09/080,992

[22] Filed: May 19, 1998

[51] Int. Cl.⁷ .................................................. H01L 21/304
[52] U.S. Cl. ............................. 438/692; 438/8; 216/88; 216/89; 156/345
[58] Field of Search .................. 156/345 LC, 345 LP; 438/8, 692; 216/88, 89

[56] References Cited

U.S. PATENT DOCUMENTS

| | | | |
|---|---|---|---|
| 5,240,552 | 8/1993 | Yu et al. | 156/636 |
| 5,244,534 | 9/1993 | Yu et al. | 156/636 |
| 5,439,551 | 8/1995 | Meikle et al. | 156/626.1 |
| 5,540,810 | 7/1996 | Sandhu et al. | 156/636.1 |
| 5,639,388 | 6/1997 | Kimura et al. | 216/84 |
| 5,647,952 | 7/1997 | Chen | 156/636.1 |
| 5,653,624 | 8/1997 | Ishikawa et al. | 451/287 |
| 5,720,845 | 2/1998 | Liu | 156/345 |
| 5,770,095 | 6/1998 | Sasaki et al. | 216/38 |

*Primary Examiner*—Richard Bueker
*Assistant Examiner*—Alva C Powell

[57] ABSTRACT

The present invention provides a method for polishing a semiconductor substrate having a first layer of material formed on a second layer of different material. In one embodiment, the method includes placing the semiconductor substrate against a polishing surface and polishing the semiconductor substrate, producing a first vibration by polishing and removing the first layer, producing a second vibration by polishing at least a portion of the second layer, and detecting a change from the first vibration to the second vibration with a vibration sensor. The vibration that is sensed in the present invention is physical or mechanical vibration, and it is not a vibration associated with a change in temperature. The vibration sensor may be of varying types. For example, the vibration sensor may be an acoustic sensor or an ultrasonic sensor.

14 Claims, 4 Drawing Sheets

DEVICE AND METHOD FOR POLISHING A SEMICONDUCTOR SUBSTRATE

TECHNICAL FIELD OF THE INVENTION

The present invention is directed, in general, to a device and method for determining an endpoint in a chemical-mechanical polishing process for a semiconductor substrate and, more specifically, to a device and method for determining an endpoint with a vibrational sensor.

BACKGROUND OF THE INVENTION

In the fabrication of semiconductor components, metal conductor lines are formed over a substrate containing device circuitry. The metal conductor lines serve to interconnect discrete devices, and thus form integrated circuits. The metal conductor lines are further insulated from the next interconnection level by thin films of insulating material deposited by, for example, CVD (Chemical Vapor Deposition) of oxide or application of SOG (Spin On Glass) layers followed by fellow processes. Holes, or vias, formed through the insulating layers provide electrical connectivity between successive conductive interconnection layers. In such wiring processes, it is desirable that the insulating layers have a smooth surface topography, since it is difficult to lithographically image and pattern layers applied to rough surfaces.

Also, deep (greater than 3 $\mu$m) and narrow (less than 2 $\mu$m) trench structures have been used in advanced semiconductor design for three major purposes: (1) to prevent latchup and to isolate n-channel from p-channel devices in CMOS circuits; (2) to isolate the transistors of bipolar circuits; and (3) to serve as storage-capacitor structures in DRAMS. However in this technology it is even more crucial to precisely determine the endpoint of differing materials to prevent unnecessary dishing out of the connector metal.

Chemical-mechanical polishing (CMP) has been developed for providing smooth insulator topographies. CMP can also be used to remove different layers of material from the surface of a semiconductor wafer. For example, following via formation in a dielectric material layer, a metallization layer is blanket deposited and then CMP is used to produce planar metal studs. Briefly, the CMP processes involve holding and rotating a thin, flat semiconductor wafer against a wetted polishing surface under controlled chemical, pressure, and temperature conditions. A chemical slurry containing a polishing agent, such as alumina or silica, is used as the abrasive material. Additionally, the chemical slurry contains selected chemicals which etch or oxidize various surfaces of the wafer during processing. The combination of mechanical and chemical removal of material during polishing results in superior planarization of the polished surface. In this process it is important to remove a sufficient amount of material to provide a smooth surface, without removing an excessive amount of underlying materials. The accurate material removal is particularly important in today's submicron technologies where the layers between device and metal levels are constantly getting thinner. Therefore, a precise polishing endpoint detection technique is highly desirable.

In the past, endpoint has been detected by interrupting the CMP process, removing the wafer from the polishing apparatus, and physically examining the wafer surface by techniques which ascertain film thickness and/or surface topography. In these processes, if the wafer did not meet specifications, it was loaded back into the polishing apparatus for further planarization. If too much material was removed, the wafer was often substandard to the specifications or had to be discarded altogether. By experience, an elapsed CMP time has been developed with some accuracy for a given CMP process. However, this endpoint detection method is time consuming, unreliable, and costly.

Various active processes have been developed to circumvent the problems associated with this particular endpoint detection method. However, these active processes suffer from their own disadvantages and inaccuracies.

Accordingly, what is needed in the art is an improved passive method of more accurately determining the end point of one semiconductor wafer layer and the beginning of the next layer.

SUMMARY OF THE INVENTION

To address the above-discussed deficiencies of the prior art, the present invention provides a method for polishing a semiconductor substrate having a first layer of material formed on a second layer of different material. In one embodiment, the method includes placing the semiconductor substrate against a polishing surface and polishing the semiconductor substrate, producing a first vibration by polishing and removing the first layer, producing a second vibration by polishing at least a portion of the second layer, and detecting a change from the first vibration to the second vibration with a vibration sensor. The vibration that is sensed in the present invention is physical or mechanical vibration, and it is not a vibration associated with a change in temperature. The vibration sensor may be of varying types. For example, the vibration sensor may be an acoustic sensor or an ultrasonic sensor.

Thus, a broad scope of the present invention provides a method whereby the endpoint of different materials may be determined with the use of a vibration sensor to detect a change in the vibration that occurs when one material has been removed and polishing on an underlying layer begins. This method, therefore, provides a process for quickly determining when a material, such as tungsten or stacked metal layer, has been polished and planarized down to the dielectric material. This is particularly helpful in present day technologies where trench etching has become an important part in forming even more precise integrated circuits. In such processes, it becomes even more critical not to over etch the dielectric material.

In one embodiment, detecting includes holding the semiconductor substrate against a rotating polishing head and against the polishing surface wherein the rotating polishing head has the vibration sensor coupled thereto. In this particular embodiment, the vibration sensor may even be integrally incorporated into the polishing head itself. Thus, as the polishing process removes one layer and contacts another, the vibration associated with the change in materials will be evidenced by a change in vibration that is transmitted to the vibration sensor.

In another embodiment, the polishing surface has a polishing slurry thereon and producing the first vibration and producing the second vibration include polishing the first layer and the second layer with the polishing slurry. The first and second layers are typically different materials, but both may be comprised of metal. For example, the first layer may be tungsten or a multi-layered stack metal, and the second layer may be a titanium/titanium nitride barrier layer. In such embodiments, the same slurry may be used because some metals typically can be polished or removed with the same slurry. The polishing slurry comprises an abrasive and an oxidizer. In another aspect of this particular embodiment, the method further includes changing from the polishing slurry to a different polishing slurry subsequent to the detection of the second vibration. In such embodiments, the first layer will most often be composed of a metal or metal stack and the second layer may be a dielectric material. Further, the polishing slurry may comprise aluminum oxide as an abrasive and ferric nitrate or hydrogen peroxide as an oxidizer, and the different slurry comprises silica as an abrasive and ammonia or potassium hydroxide as an oxidizer.

As mentioned above, the first layer may comprise various types of metals as a single layer or may be various stacked metals. Thus, in one embodiment, the first layer may comprise layers of different metals selected from the group consisting of titanium, titanium nitride, tungsten, aluminum, and copper, and the second layer is a dielectric material.

Another aspect of the present invention comprises a polishing apparatus that includes a turntable having a polishing cloth thereon, a polishing head configured to hold an object having a surface to be polished wherein the polishing head is coupled to a support shaft configured to transmit a force against the polishing head, a retaining ring coupled to the polishing head for retaining the object on the polishing head, and a vibration sensor coupled to the polishing apparatus wherein the vibration sensor is capable of detecting a vibration created when the surface of the object is polished. In an advantageous embodiment, the vibration sensor is integrally coupled to the polishing head and may be an acoustic sensor or an ultrasonic sensor. The apparatus may further comprise a slurry dispenser for dispensing a polishing slurry on the turntable.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

The method of planarizing the surface of a semiconductor wafer, using chemical/mechanical polishing (CMP), and the new and improved method of endpoint detection will now be described in detail. The method can be used for planarizing: (a) insulator surfaces, such as silicon oxide or silicon nitride, deposited by chemical vapor deposition; (b) insulating layers, such as glasses deposited by spin-on and reflow deposition means, over semiconductor devices; or (c) metallic conductor interconnection wiring layers.

Figure 1A:
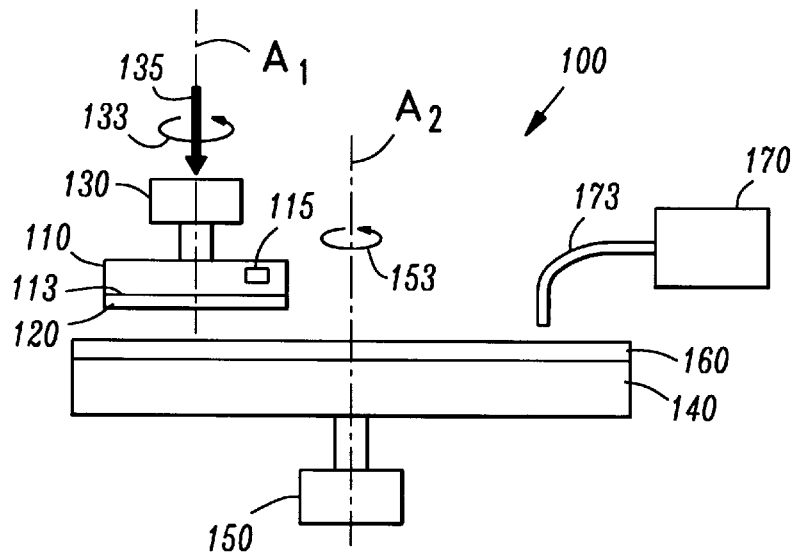
FIGS. 1A and 1B illustrate schematic sectional and plan views of an exemplary embodiment of a chemical/mechanical planarization (CMP) apparatus for use in accordance with the method of the invention.

Referring initially to FIG. 1A, illustrated is a schematic sectional view of an exemplary embodiment of a chemical/mechanical planarization (CMP) apparatus for use in accordance with the method of the invention. The CMP apparatus 100 includes a wafer carrier or polishing head 110 for holding a semiconductor wafer 120. The wafer carrier 110 comprises a retaining ring 113 and a vibration sensor 115. The wafer carrier 110 is mounted to a drive motor 130 for continuous rotation about axis A1 in a direction indicated by arrow 133. The wafer carrier 110 is adapted so that a force indicated by arrow 135 is exerted on the semiconductor wafer 120. In an alternative embodiment, the vibration sensor 115 may be an acoustic sensor. In yet another embodiment, the vibration sensor 115 may be an ultrasonic sensor. The CMP apparatus 100 also comprises a polishing platen 140 mounted to a drive motor 150 for continuous rotation about axis A2 in a direction indicated by arrow 153. A polishing pad 160 formed of a material, such as blown polyurethane, is mounted to the polishing platen 140, which provides a polishing surface for the process. A polishing slurry containing an abrasive fluid, such as silica or alumina abrasive particles suspended in either a basic or an acidic solution, is dispensed onto the polishing pad 160 through a conduit 173 from a temperature controlled reservoir 170.

Figure 1B:
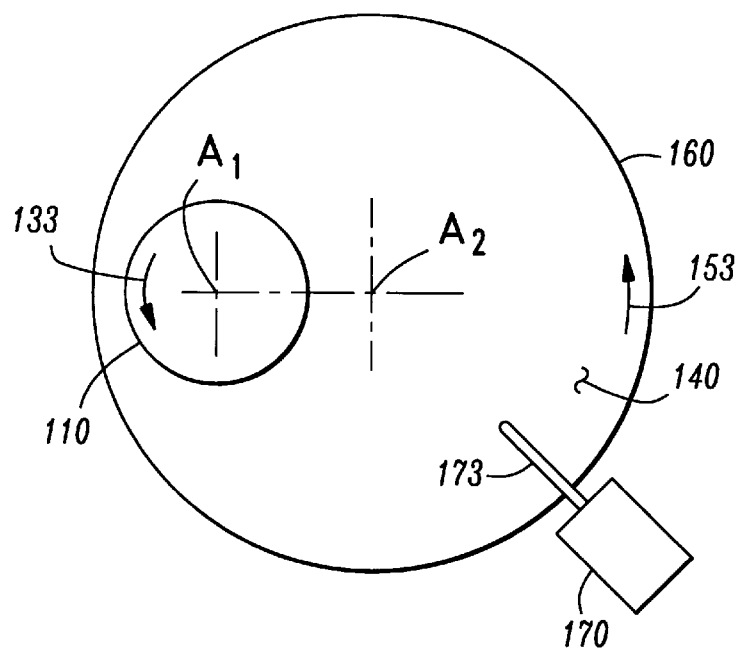

Referring now to FIG. 1B, illustrated is a schematic plan view of the CMP apparatus of FIG. 1A with the key elements shown. The wafer carrier 110 is shown to rotate in a direction indicated by arrow 133 about the axis A1. The polishing platen 160 is shown to rotate in a direction indicated by arrow 153 about the axis A2. The polishing slurry is dispensed onto the polishing pad 160 through conduit 173 from the temperature controlled reservoir 170.

Figure 2:
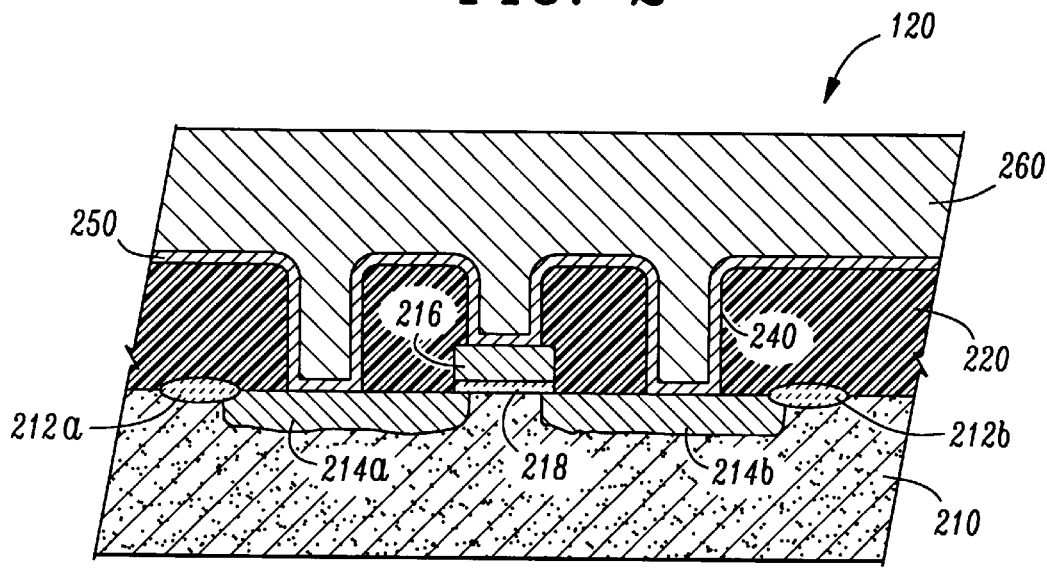
FIG. 2 illustrates a sectional view of an exemplary metal oxide semiconductor (MOS) wafer awaiting chemical/mechanical planarization.

Referring now to FIG. 2, illustrated is a sectional view of an exemplary metal oxide semiconductor (MOS) wafer awaiting chemical/mechanical planarization. The semiconductor wafer 120 includes a substrate 210, which may be formed from materials such as silicon, germanium, gallium arsenide or other materials known to those skilled in the art. The substrate 210 will typically include field oxide regions 212a, 212b and doped source and drain regions 214a, 214b, both of which are formed by conventional processes. A gate 216 positioned on a gate oxide 218 may also be formed on the substrate 210. Both the gate 216 and the gate oxide 218 are also formed by conventional processes. Deposited over the gate 216 and the substrate 210, is a dielectric layer 220. In advantageous embodiments, the dielectric layer 220 is deposited by a conventional process using well known materials such as tetraethyl orthosilicate (TEOS). In another embodiment, the dielectric layer 220 may be doped with phosphorous and/or boron.

In one embodiment, a photoresist layer (not shown) may be formed on the dielectric layer 220 and selectively exposed. The photoresist layer is used to form a plurality of contact openings 240, which may also be vias, in the dielectric 220 by conventional processes, which are well known to those who are skilled in the art. Following the etching of the contact openings 240, the photoresist layer is removed by conventional processes also known to those who are skilled in the art.

Following the completion of the contact openings 240, a barrier layer 250 may be deposited in the contact openings 240 and on the dielectric layer 220. In an advantageous embodiment, the barrier layer 250 is composed of a layer of titanium (Ti) and a layer of titanium nitride (TiN). In an alternative embodiment, the barrier layer 250 may be composed of tantalum (Ta) and tantalum nitride (TaN). The barrier layer 250 is formed by first depositing a layer of Ti using a conventional process, such as physical vapor deposition. Following the deposition of the Ti layer, a second layer of TiN is deposited, also using conventional processes well known in the art, over the first Ti layer. After the formation of the barrier layer 250, a conductive material 260 is deposited, using conventional processes, over the barrier layer 250 and in the contact openings 240. In an advantageous embodiment, the conductive material is tungsten (W). In an alternative embodiment, however, the conductive material may be copper (Cu) or aluminum (Al). The conductive material 260 is used to "plug" the contact openings 240 to provide electrically conductive paths from the source and drain regions 214a, 214b and gate 216 to a metal interconnect layer yet to be formed. In preparation for the deposition of the metal interconnect layer (not shown), the portions of the conductive material 260 and the barrier layer 250 that do not reside in the contact openings 240 are removed by chemical/mechanical planarization.

Figure 3:
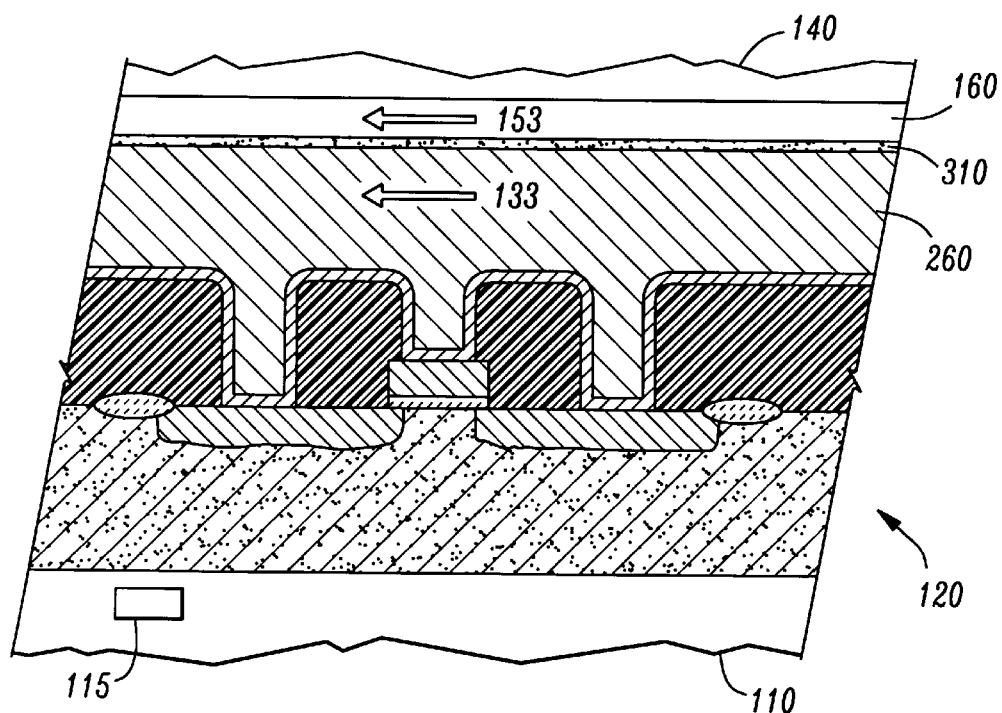
FIG. 3 illustrates an enlarged inverted sectional view of the MOS wafer of FIG. 2 positioned proximate the polishing pad of FIGS. 1A and 1B.

Referring now to FIG. 3 with continuing reference to FIGS. 1A, 1B and 2, illustrated is an enlarged inverted sectional view of the MOS wafer of FIG. 2 positioned proximate the polishing pad of FIGS. 1A and 1B. FIG. 3 is inverted with respect to the normal orientation shown in FIG. 1A for ease of continuing reference to the sectional view of FIG. 2. The CMP process is initiated with the removal of the conductive material layer 260. The wafer 120 is installed in the wafer carrier 110 and is held in place by the retaining ring 113 so that the conductive material 260 surface is separated from the polishing pad 160 by a layer of slurry 310. The CMP proceeds in a conventional manner with the slurry 310 ejected onto the surface of the polishing pad 160 as both the platen 140 and the wafer carrier 110 rotate about axes A2 and A1, as shown by arrows 153 and 133, respectively. The slurry 310 used for polishing the conductive material 260, which is typically tungsten, comprises an abrasive component and an oxidizer component. In an advantageous embodiment, aluminum oxide and ferric nitrate are used as the abrasive and oxidizer, respectively, in the slurry. In another embodiment, hydrogen peroxide is used as an oxidizer in the slurry. In the CMP process, the conductive material 260 is removed by a combination of chemical, i.e., etching, and physical, i.e., mechanical abrasion, processes. When the wafer carrier 110 and the semiconductor wafer 120 are pressed onto the slurry 310 on the revolving platen 160, typically at pressures of approximately 6 to 8 psi, the oxidizing component of the slurry 310 oxidizes the conductive material 260 to form a thin layer of metal oxide. This metal oxide is then readily removed by the slurry's abrasive component. As each layer of metal oxide is removed, a new layer is formed by the chemical action of the oxidizer in the slurry 310. The process of removing the tungsten layer 260 produces a signature vibration, which is associated with its removal, that can be detected and monitored by the vibration sensor 115.

Figure 4:
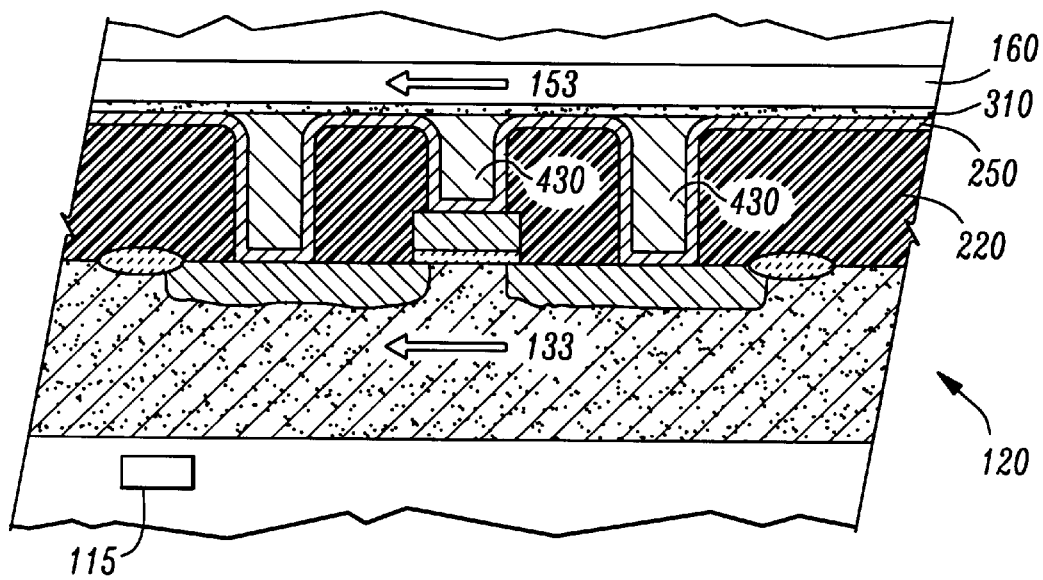
FIG. 4 illustrates an enlarged inverted sectional view of the MOS wafer of FIG. 2 with the conductive layer removed.

Referring now to FIG. 4 with continuing reference to FIG. 3, illustrated is an enlarged inverted sectional view of the MOS wafer of FIG. 2 with the conductive layer removed. When the conductive material 260 has been chemically and physically abraded down to the titanium/titanium nitride level 250, the physical conditions change due to the change in the material. The largest percentage of the exposed surface of the semiconductor wafer 120 is now titanium/titanium nitride, with a minor percentage of the surface being the exposed portion of the tungsten plugs 430. The tungsten layer 260 and the titanium/titanium nitride layer 250, of course, have different hardnesses and coefficients of friction. This change in hardness and coefficient of friction causes a change in the frequency of the vibrations being sensed by the acoustic sensor 115. Thus, it can be accurately determined when the surface being planarized has changed material, in this case from tungsten to titanium/titanium nitride, by the change in vibration frequency. Likewise, the process may continue through the titanium/titanium nitride layer 250 and into the dielectric layer 220. Thus, the removal of each substantive layer causes a detectable change in the signature vibration frequency associated with that particular substantive layer.

Figure 5:
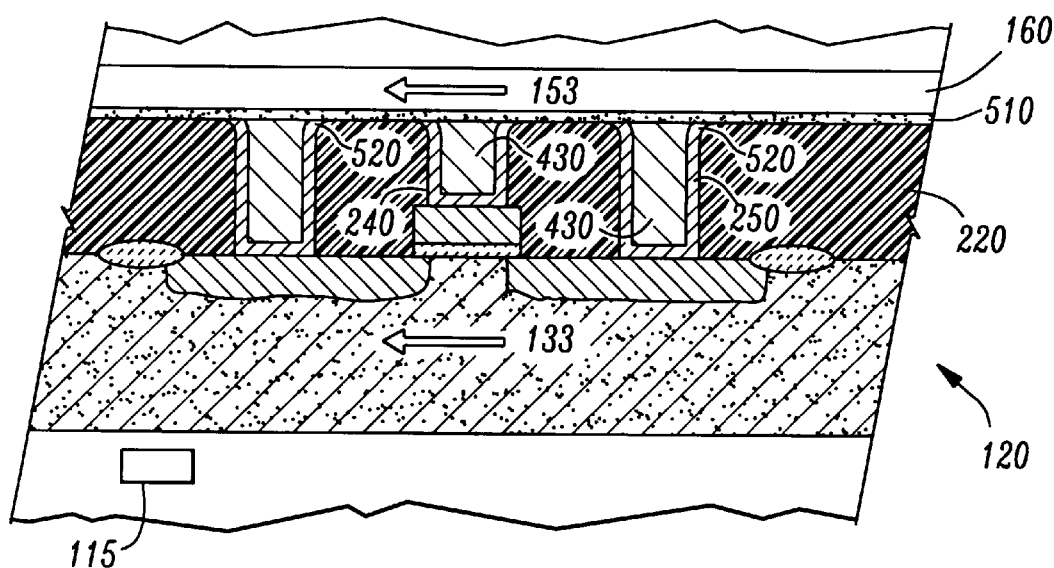
FIG. 5 illustrates an enlarged inverted sectional view of the MOS wafer of FIG. 2 with the titanium/titanium nitride layer removed.

Referring now to FIG. 5 with continuing reference to FIG. 4, illustrated is an enlarged inverted sectional view of the MOS wafer of FIG. 2 with the titanium/titanium nitride layer removed. When the polishing pad 160 and slurry 310 complete the removal of the titanium/titanium nitride layer 250, the vibration detected by the vibration sensor 115 changes again as the largest percentage of the exposed surface is now dielectric 220. Upon detecting the vibrational change from the titanium/titanium nitride layer 250 to the dielectric layer 220, a new slurry 510 composition is employed. The new slurry 510 is required because the silicon that is used to form the dielectric layer 220 will not readily oxidize in ferric nitrate or hydrogen peroxide. The new slurry may be comprised of silica and a base. In an advantageous embodiment, the slurry has a pH ranging from about 7 to about 11, and for example, the base may be ammonia or potassium hydroxide. As illustrated, if the polishing is stopped at this point, portions of the titanium/titanium nitride layer 250 that are at the surface of the semiconductor wafer 120 are rounded-over 520 as the titanium/titanium nitride layer 250 exits the contact openings 240. This makes the contact area of the tungsten plugs 430 unnecessarily large. With the new slurry 510, the CMP process continues, removing a small portion of the dielectric layer 220 until the rounding 520 is removed.

Figure 6:
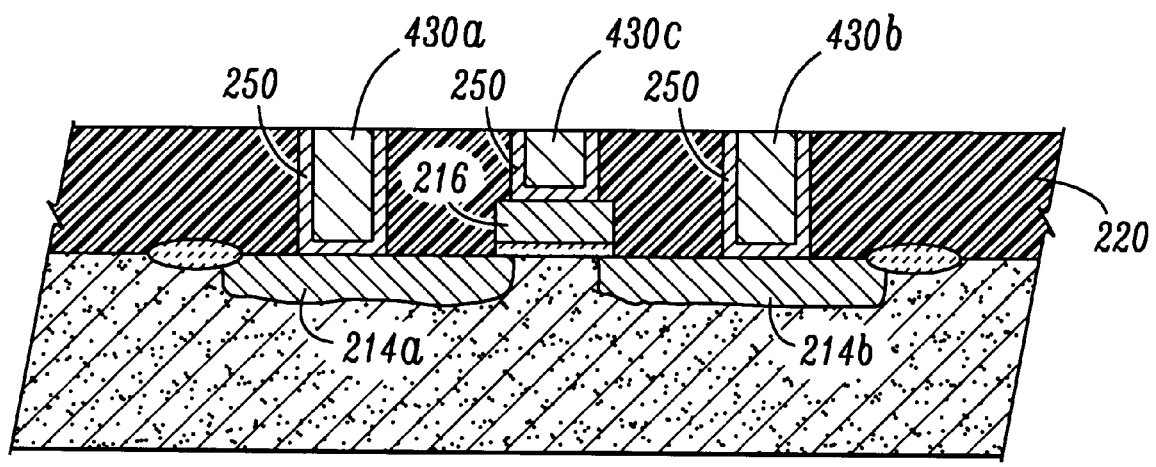
FIG. 6 illustrates an enlarged sectional view of the MOS wafer of FIG. 2 with the rounded-over portions of the titanium/titanium nitride layer removed.

Referring now to FIG. 6 with continuing reference to FIG. 5, illustrated is an enlarged sectional view of the MOS wafer of FIG. 2 with the rounded-over portions of the titanium/titanium nitride layer removed. A portion of the dielectric layer 220 and the rounded-over portions 520 of the titanium/titanium nitride layer 250 have been removed. This removal sharpens the definition of the tungsten plugs, collectively 430, as they appear on the surface of the dielectric layer 220. The tungsten plugs 430a, 430b, 430c are isolated from the dielectric 220 by remnants of the barrier layer 250 while connecting to the drain regions 214a, 214b and gate 216, respectively. The CMP process is complete and the tungsten plugs 430 are exposed and ready for the deposition of a metal interconnect layer.

The above description has delineated layers of tungsten, titanium, titanium nitride, and a dielectric. Those who are skilled in the art will readily recognize the method will also work with other materials, e.g., copper, aluminum, tantalum, tantalum nitride, etc., which are also commonly used in semiconductor wafers.

From the foregoing, it is readily apparent that the present invention provides a method for polishing a semiconductor substrate having a first layer of material formed on a second layer of different material. In one embodiment, the method includes placing the semiconductor substrate against a polishing surface and polishing the semiconductor substrate, producing a first vibration by polishing and removing the first layer, producing a second vibration by polishing at least a portion of the second layer, and detecting a change from the first vibration to the second vibration with a vibration sensor. The vibration that is sensed in the present invention is a physical or mechanical vibration, and it is not a vibration associated with a change in temperature. The passive vibration sensor may be of varying types. For example, the vibration sensor may be an acoustic sensor or an ultrasonic sensor.

Although the present invention has been described in detail, those skilled in the art should understand that they can make various changes, substitutions and alterations herein without departing from the spirit and scope of the invention in its broadest form.

What is claimed is:

1. A method for polishing a semiconductor substrate having a first layer of material formed on a second layer of different material formed thereon, comprising:

placing said semiconductor substrate against a rotating polishing head and against a polishing surface, said rotating polishing head having an ultrasonic sensor attached thereon;

polishing said semiconductor substrate;

producing a first ultrasonic vibration by polishing and removing said first layer;

producing a second ultrasonic vibration by polishing at least a portion of said second layer; and detecting a change from said first ultrasonic vibration to said second ultrasonic vibration with an ultrasonic sensor.

2. The method as recited in claim 1 wherein said polishing surface has a polishing slurry thereon and producing said first ultrasonic vibration and producing said second ultrasonic vibration include polishing said first layer and said second layer with said polishing slurry.

3. The method as recited in claim 2 wherein said first layer and second layers comprise different metals.

4. The method as recited in claim 2 wherein said polishing slurry comprises an abrasive and an oxidizer.

5. The method as recited in claim 2 further including changing said polishing slurry to a different polishing slurry subsequent to the detection of said second ultrasonic vibration.

6. The method as recited in claim 5 wherein said polishing slurry comprises aluminum oxide as an abrasive and ferric nitrate or hydrogen peroxide as an oxidizer and said different slurry comprises silica as an abrasive and ammonia or potassium hydroxide as an oxidizer.

7. The method as recited in claim 1 wherein said first layer comprises layers of different metals selected from the group consisting of titanium, titanium nitride, tungsten, aluminum, and copper, and said second layer is a dielectric material.

8. A method for chemically/mechanically polishing a semiconductor substrate having a first layer of material formed on a second layer of different material formed thereon, comprising:

placing said semiconductor substrate against a rotating polishing head and against a polishing surface having a polishing slurry thereon, said rotating polishing head having an ultrasonic sensor attached thereon;

polishing said semiconductor substrate;

producing a first ultrasonic vibration by polishing and removing said first layer;

producing a second ultrasonic vibration by polishing at least a portion of said second layer; and detecting a change from said first ultrasonic vibration to said second ultrasonic vibration with an ultrasonic sensor.

9. The method as recited in claim 8 wherein said first layer is multi-layered wherein each layer comprises different metals selected from the group consisting of titanium, titanium nitride, tungsten, aluminum, and copper, and said second layer is a dielectric material.

10. The method as recited in claim 8 wherein said polishing slurry comprises an abrasive and an oxidizer.

11. The method as recited in claim 8 further including changing said polishing slurry to a different polishing slurry subsequent to the detection of said second ultrasonic vibration.

12. The method as recited in claim 11 wherein said polishing slurry comprises aluminum oxide as an abrasive and ferric nitrate or hydrogen peroxide as an oxidizer and said different slurry comprises silica as an abrasive and ammonia or potassium hydroxide as an oxidizer.

13. A polishing apparatus, comprising:

a turntable having a polishing cloth thereon;

a polishing head configured to hold an object having a surface to be polished, said polishing head coupled to a support shaft configured to transmit a force against said polishing head;

a retaining ring coupled to said polishing head for retaining said object on said polishing head; and an ultrasonic sensor integrally attached to said polishing head, said ultrasonic sensor capable of detecting an ultrasonic vibration created when said surface of said object is polished.

14. The polishing apparatus of claim 13 further comprising a slurry dispenser for dispensing a polishing slurry on said turntable.

* * * * *